United States Patent
Furuta (10) Patent No.: US 9,263,485 B2
(45) Date of Patent: Feb. 16, 2016

(54) SOLID-STATE IMAGING APPARATUS AND METHOD FOR MANUFACTURING THE SAME

(71) Applicant: CANON KABUSHIKI KAISHA, Tokyo (JP)

(72) Inventor: Mariko Furuta, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/293,273

(22) Filed: Jun. 2, 2014

(65) Prior Publication Data

US 2014/0367817 A1    Dec. 18, 2014

(30) Foreign Application Priority Data

Jun. 18, 2013   (JP) .................................. 2013-127887

(51) Int. Cl.
  *H01L 27/146*   (2006.01)
(52) U.S. Cl.
  CPC ...... *H01L 27/14621* (2013.01); *H01L 27/1464* (2013.01); *H01L 27/14627* (2013.01); *H01L 27/14629* (2013.01); *H01L 27/14685* (2013.01)
(58) Field of Classification Search
  CPC ................... H01L 27/14621; H01L 27/14685; H01L 27/1463; H01L 27/14643
  See application file for complete search history.

(56) References Cited

U.S. PATENT DOCUMENTS

| | | | |
|---|---|---|---|
| 2007/0040102 A1* | 2/2007 | Mouli | 250/214.1 |
| 2008/0185500 A1* | 8/2008 | Toshikiyo | 250/208.1 |
| 2008/0230864 A1* | 9/2008 | Lee | 257/448 |
| 2011/0108938 A1* | 5/2011 | Nozaki et al. | 257/432 |
| 2013/0182162 A1 | 7/2013 | Hirayama et al. | |
| 2013/0285181 A1* | 10/2013 | Lin et al. | 257/432 |
| 2014/0239362 A1* | 8/2014 | Koo et al. | 257/294 |
| 2014/0299958 A1* | 10/2014 | Kokumai | 257/446 |

FOREIGN PATENT DOCUMENTS

| | | |
|---|---|---|
| JP | 2006-295125 | 10/2006 |
| JP | 2008-010544 | 1/2008 |
| JP | 2010-067829 | 3/2010 |

* cited by examiner

*Primary Examiner* — Tucker J Wright
(74) *Attorney, Agent, or Firm* — Fitzpatrick, Cella, Harper & Scinto (57) ABSTRACT

The present invention reduces color mixture (cross talk) and the degradation of sensitivity in a peripheral region of a pixel area to achieve a reduction of sensitivity irregularity in the pixel area. A solid-state imaging apparatus having a pixel area including a plurality of photoelectric conversion elements includes: a semiconductor substrate in which the plurality of photoelectric conversion elements are formed; a plurality of air gap formed layers which are arranged above the semiconductor substrate, and correspond to the photoelectric conversion elements in the plurality of photoelectric conversion elements, respectively; and air gaps arranged between the air gap formed layers in the plurality of air gap formed layers, respectively, wherein the air gap in a peripheral region B of the pixel area has a width larger than the air gap in a central region A of the pixel area.

8 Claims, 10 Drawing Sheets

SOLID-STATE IMAGING APPARATUS AND METHOD FOR MANUFACTURING THE SAME

BACKGROUND OF THE INVENTION

1. Field of the Invention

The present invention relates to a solid-state imaging apparatus having a pixel area including a plurality of light receiving elements, and to a method for manufacturing the same.

2. Description of the Related Art

In a conventional solid-state imaging apparatus, there has been the case where when light is incident on the solid-state imaging apparatus from an oblique direction, the light is not incident on a photoelectric conversion element (light receiving element) of a pixel on which the light should originally be incident, and the light becomes stray light, is incident on the photoelectric conversion element of an adjacent pixel, and is photoelectrically converted into an electric charge. Because of this, there has been the case where the solid-state imaging apparatus causes optical crosstalk between the adjacent pixels and imaging characteristics of the solid-state imaging apparatus are aggravated. In order to alleviate the aggravation of the imaging characteristics, Japanese Patent Application Laid-Open No. 2006-295125 proposes a technology of forming a gap (void) between color filter layers that are arranged above light receiving elements so as to correspond to the light receiving elements, respectively.

SUMMARY OF THE INVENTION

According to an aspect of the present invention, a solid-state imaging apparatus having a pixel area including a plurality of light receiving elements comprises: a semiconductor substrate in which the plurality of light receiving elements are formed, and an air gap layer arranged above the semiconductor substrate, and including a plurality of portions arranged correspondingly to the plurality of light receiving elements and air gaps arranged between the plurality of portions and having a refractive index lower than that of the plurality of portions, wherein one of the air gaps arranged in a peripheral region in the pixel area has a width larger than a width of another one of the air gaps arranged in a central region in the pixel area.

According to a further as pect of the present invention, a manufacturing method of a solid-state imaging apparatus having a pixel area including a plurality of light receiving elements comprises: forming the plurality of light receiving elements in a semiconductor substrate; forming a layer arranged above the semiconductor substrate; and forming air gaps in the layer, such that one of air gaps in a peripheral region in the pixel area has a width larger than a width of another one of air gaps in a central region in the pixel area.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The technology described in Japanese Patent Application Laid-Open No. 2006-295125 is a technology for alleviating the aggravation of the imaging characteristics by the formation of the gap (void) between each color filter layer, as has been described above. However, in a solid-state imaging apparatus on which light is incident from angles in a wide range, there have been problems that color mixture (cross talk) and the degradation of sensitivity occur in a peripheral region of an effective pixel area, even in the structure described in Japanese Patent Application Laid-Open No. 2006-295125.

The present invention is designed with respect to such problems, and an object of the present invention is to provide a solid-state imaging apparatus which achieves the reduction of sensitivity irregularity in a pixel area, and to provide a method for manufacturing the same.

The mode (embodiment) for carrying out the present invention will be described below with reference to the drawings.

First Embodiment

Firstly, a first embodiment of the present invention will be described below.

Figure 1:
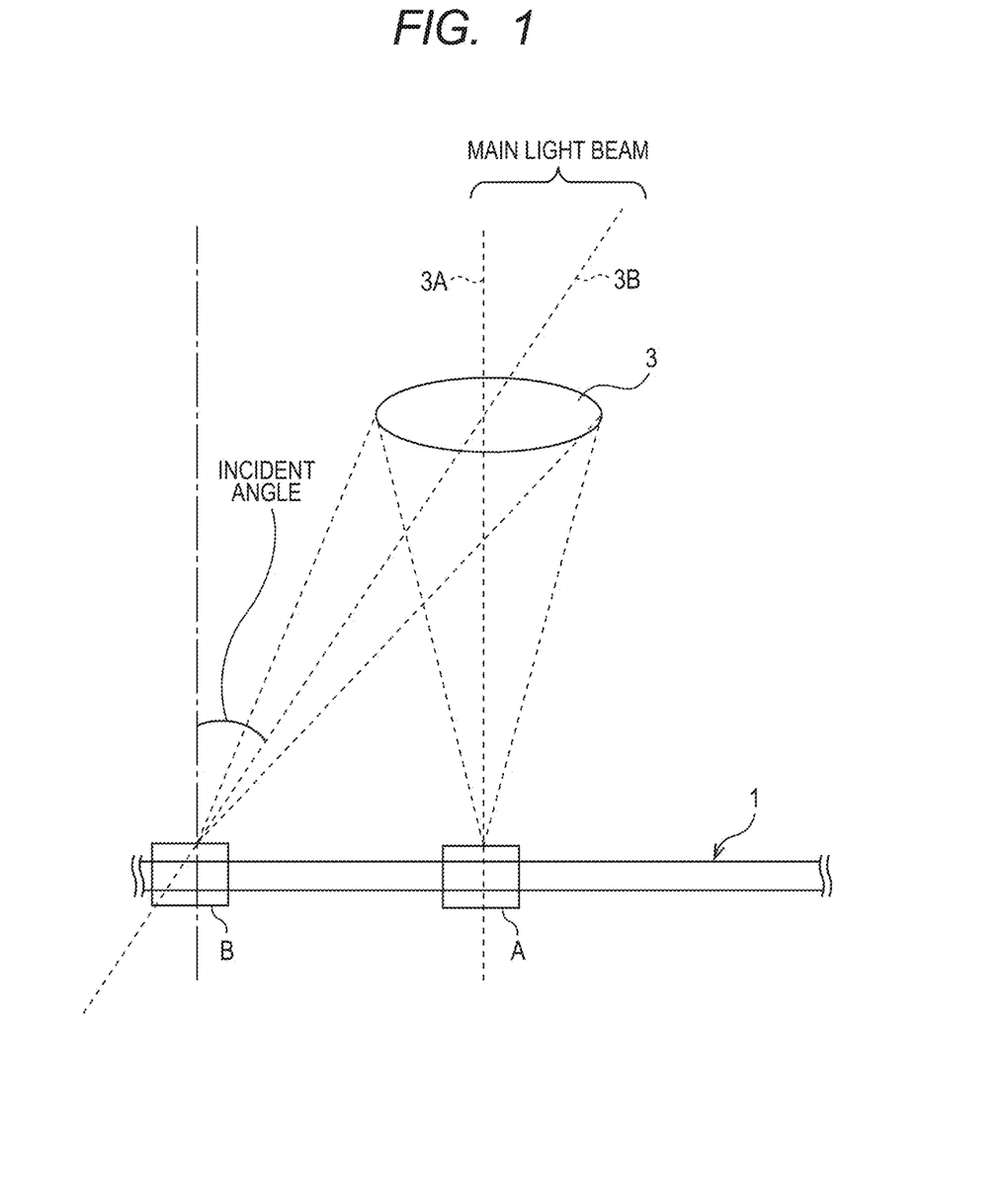
FIG. 1 is a schematic view which illustrates an embodiment of the present invention and a state of a solid-state imaging apparatus (solid-state imaging device) that receives light incident from a lens.

FIG. 1 is a schematic view which illustrates an embodiment of the present invention and a state of a solid-state imaging apparatus that receives light incident from a lens.

For instance, light which has been incident from a lens 3 of a camera irradiates a solid-state imaging apparatus 1. At this time, light including a main light beam 3A is incident on a central region (A of FIG. 1) of a pixel area (here, effective pixel area) in the solid-state imaging apparatus 1. In addition, light including a main light beam 3B is incident on a peripheral region (B of FIG. 1) of the effective pixel area in the solid-state imaging apparatus 1, which is positioned in the peripheral area with respect to the central region of the effective pixel area in the solid-state imaging apparatus 1.

Here, when a diameter (which is equivalent to the lens 3 in the case of FIG. 1) of an exit pupil of the lens 3 is large or a distance between the exit pupil and the solid-state imaging apparatus 1 is close, light having a large incident angle is incident on the peripheral region (B of FIG. 1) of the effective pixel area in the solid-state imaging apparatus 1. For instance, consider the case where a picture is taken with the use of the solid-state imaging apparatus 1 which has a size of APS-C and has the lens 3 with a focal distance of 18 mm and F 3.5. In this case, the main light beam 3B which has permeated the lens 3 is incident on the peripheral region (B of FIG. 1) of the effective pixel area in the solid-state imaging apparatus 1, at an incident angle of 30° or more. In addition, the light which has been incident on the peripheral region (B of FIG. 1) of the effective pixel area in the solid-state imaging apparatus 1 from the lens 3 includes light having an incident angle larger than the incident angle of the main light beam 3B, as is clear from FIG. 1.

Figure 2:
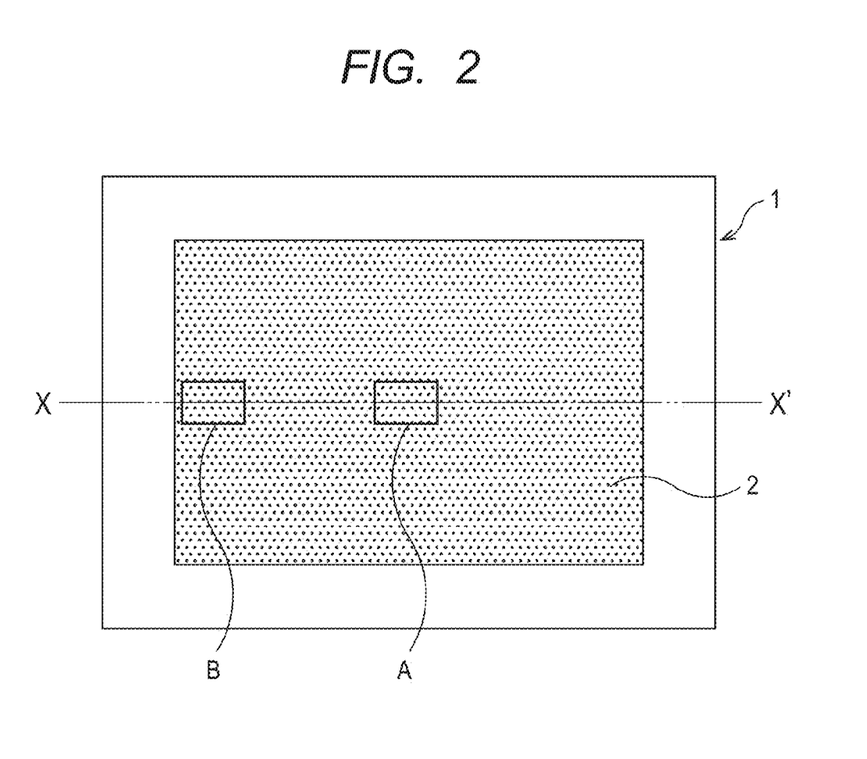
FIG. 2 is a top plan view of the solid-state imaging apparatus according to the embodiment of the present invention.

FIG. 2 is a top plan view of the solid-state imaging apparatus according to the embodiment of the present invention.

As is illustrated in FIG. 2, the solid-state imaging apparatus 1 has an effective pixel area 2 having a photoelectric conversion element (light receiving element) formed therein. For instance, a plurality of pixels which have each an photoelectric conversion element therein are arranged, for instance, in a two-dimensional matrix form and are formed in the effective pixel area 2. In FIG. 2, a central region A of the effective pixel area 2 in the solid-state imaging apparatus 1, and a peripheral region B of the effective pixel area 2 in the solid-state imaging apparatus 1 are illustrated.

Figure 3A:
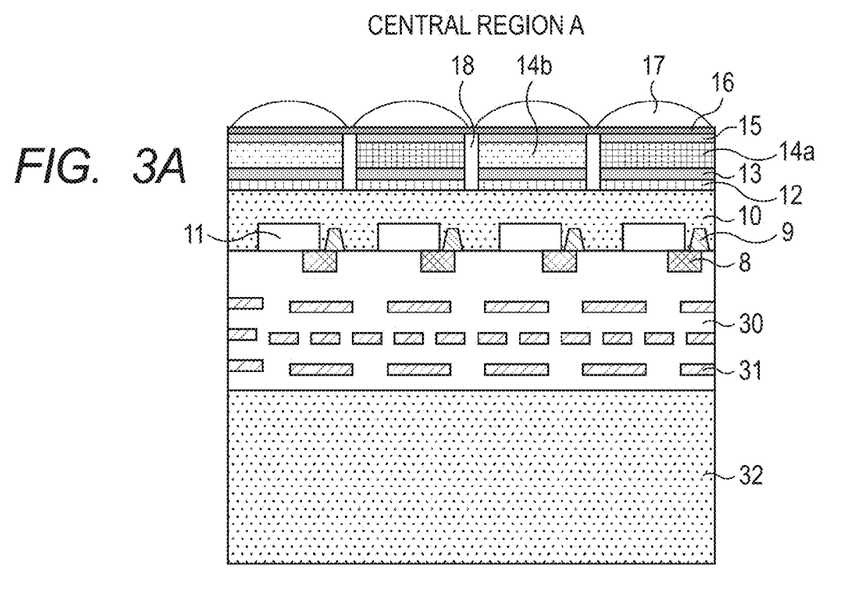
FIG. 3A is a sectional view of a solid-state imaging apparatus according to a first embodiment of the present invention.
Figure 3B:
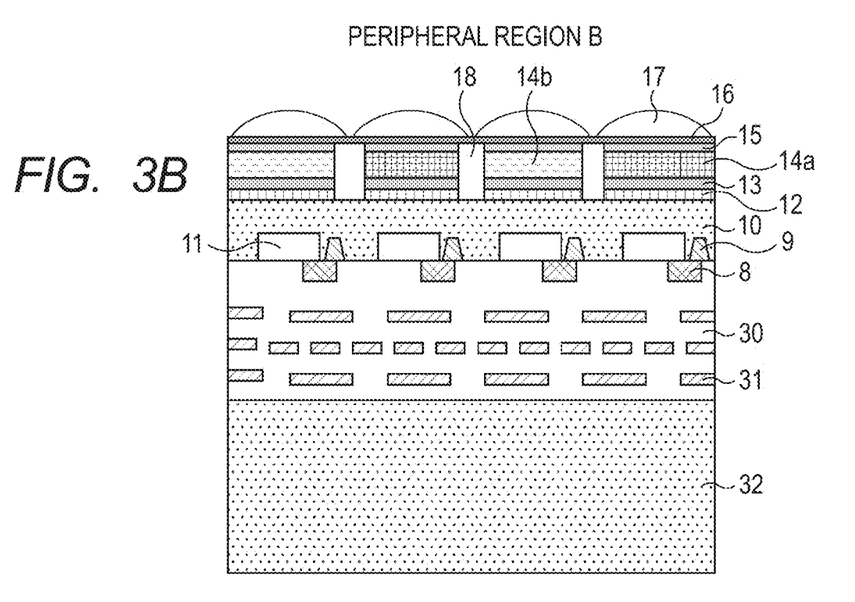
FIG. 3B is a sectional view of the solid-state imaging apparatus according to the first embodiment of the present invention.

FIGS. 3A and 3B are sectional views of the solid-state imaging apparatus according to the first embodiment of the present invention. In FIGS. 3A and 3B, FIG. 3A is a schematic sectional view of the central region A of the effective pixel area 2 out of a cross section taken along the line X-X' illustrated in FIG. 2; and FIG. 3B is a schematic sectional view of the peripheral region B of the effective pixel area 2 out of the cross section taken along the line X-X' illustrated in FIG. 2.

The solid-state imaging apparatus 1 according to the present embodiment illustrated in FIGS. 3A and 3B is so-called back side illumination type of solid-state imaging apparatus, in which light is incident on a photoelectric conversion element 11 from the other face (front face) in an opposite side to one face (rear face) on which a gate electrode 8 is formed, in the semiconductor substrate 10.

Here, the structure of the solid-state imaging apparatus 1 according to the present embodiment will be described below with reference to FIG. 3A.

The semiconductor substrate 10 is formed from a semiconductor which has an N-type or P-type of conductivity, for instance, from silicon.

The photoelectric conversion element 11 is a semiconductor region which functions as a charge accumulation region, is formed on each of the pixels, forms a PN junction together with the semiconductor substrate 10, and has opposite conductivity type to that of the semiconductor substrate 10.

An element separator 9 is a component for electrically separating the photoelectric conversion elements 11 from each other, and can employ, for instance, an insulating film separator such as LOCOS separator and STI separator, or a PN junction separator (diffusion separator) by a semiconductor region having an opposite conductivity type to that of the photoelectric conversion element 11.

The gate electrode 8 is a gate electrode of a transistor which constitutes the pixel, and is formed, for instance, from polysilicon. More specifically, the gate electrode 8 is a gate electrode of a transfer transistor for transferring an electric charge which has been generated in the photoelectric conversion element 11 that has been formed so as to correspond to the gate electrode.

An interlayer insulation layer 30 is a layer for electrically separating the gate electrode 8 from a wiring layer 31 or separating different wiring layers 31 from each other, and is formed, for instance, from a silicon oxide.

The wiring layer 31 is provided as a multilayer wiring layer formed of three or more layers, in the example illustrated in FIGS. 3A and 3B. This wiring layer 31 is formed, for instance, from a material which contains aluminum (Al), a copper (Cu) or the like as a main component.

A supporting substrate 32 is a supporting substrate for forming color filter layers 14a, 14b and the like in a side of one face in an opposite side to the other face of the semiconductor substrate 10, on which the photoelectric conversion element 11 is formed. This supporting substrate 32 is arranged so as to contact the interlayer insulation layer 30. Incidentally, an adhesive and the like may be arranged between the supporting substrate 32 and the interlayer insulation layer 30.

A protective layer 12 is arranged so as to contact one face in an opposite side to a face (the other face) of the semiconductor substrate 10, which contacts the interlayer insulation layer 30. This protective layer 12 is formed, for instance, from a silicon nitride. Incidentally, an antireflection layer formed, for instance, from a silicon oxide or a silicon oxynitride can also be arranged between this protective layer 12 and the semiconductor substrate 10.

A first planarizing layer 13 is formed on the protective layer 12, and functions as an underlayer, for instance, of the color filter layers 14a and 14b. The upper face of this first planarizing layer 13 is planarized by planarizing treatment. In the present embodiment, this first planarizing layer 13 is formed of a layer which is formed of an organic insulator of one layer, but can be formed of a layer which is formed, for instance, from an inorganic insulator, or of a plurality of layers.

The first color filter layer 14a is formed on the first planarizing layer 13, and is formed from a resin containing a coloring matter, for instance, of red (R).

The second color filter layer 14b is formed on the first planarizing layer 13, and is formed from a resin containing a coloring matter, for instance, of green (G).

Here, in the present embodiment, it is possible to apply, for instance, a so-called Bayer array as the array of the color filter layers. In this case, for instance, in rows of adjacent upper and lower pixels in a cross section taken along the line X-X' illustrated in FIG. 2, a geometry is adopted in which a pixel in the second color filter layer 14b formed from the resin containing the coloring matter, for instance, of the green (G) and a pixel in a third color filter layer (not shown in FIGS. 3A and 3B) formed from a resin containing a coloring matter, for instance, of blue (B) are alternately arranged.

Incidentally, in the present example, the example is illustrated in which the first color filter layer 14a is a filter layer of red (R) and the second color filter layer 14b is a filter layer of green (G), but the colors may be reversed. Specifically, it is also acceptable to determine the first color filter layer 14a to be the filter layer of the green (G) and the second color filter layer 14b to be the filter layer of the red (R).

A second planarizing layer 15 is formed on each of the color filter layers, and functions as an underlayer, for instance, of a microlens 17. The upper face of this second planarizing layer 15 may also be planarized by planarizing treatment such as a CMP method. In the present embodiment, this second planarizing layer 15 is determined to be formed from a resin, but can be formed, for instance, from an inorganic insulator such as a silicon oxide. The color filter layers (14a, 14b and the like) are formed so as to have each different thickness (film thicknesses), for instance. Even in such a case, by the second planarizing layer 15 which has a planarized upper face and is arranged on the upper face of each of the color filter layers, a step formed by the different film thicknesses between the color filter layers can be reduced (eliminated).

An air gap 18 is formed in an upper region of a portion between at least two photoelectric conversion elements out of the plurality of photoelectric conversion elements 11, in an air gap formed layer (in the present embodiment, protective layer 12, first planarizing layer 13, color filter layers 14a and 14b and second planarizing layer 15). In other words, the air gap formed layer is separated to constitute the air gap layer. The air gap layer includes a plurality of air gaps 18, and a plurality of portions having a higher refractive index than that of the plurality of air gaps 18. For instance, the air gap formed layer which has been a single piece is separated into the plurality of air gap formed layers (portions) by the air gap 18. This air gap 18 is in a state of being filled with air or being under vacuum. By having this air gap 18 arranged therein, the solid-state imaging apparatus can enhance light-condensing efficiency toward the photoelectric conversion element 11 while using the reflection of light on the boundary of this air gap 18. In the present embodiment, the air gap 18 in the peripheral region (B of FIG. 1 and FIG. 2) of the effective pixel area illustrated in FIG. 3B is formed so as to have a width larger than the air gap 18 in the central region (A of FIG. 1 and FIG. 2) of the effective pixel area illustrated in FIG. 3A. This is because light having an incident angle larger than that in the central region A in the effective pixel area is incident on the peripheral region B in the effective pixel area, and accordingly the solid-state imaging apparatus forms the air gap 18 having a large width in the peripheral region B (in other words, air gap formed layer having small width to be formed) so that the boundary of the air gap 18 can reflect light even when light having a large incident angle is incident on the boundary, as has been described with reference to FIG. 1. Here, the air gap is also referred to as a gap or void. Here, the width to be formed of the air gap formed layer can also be described as the width of the portion, and can also be described as the distance between the air gaps in the air gap formed layer. Incidentally, in the following description, the air gap layer and the plurality of portions are occasionally referred to as the air gap formed layer.

A sealing layer (cap layer) 16 is a layer for sealing the air gap 18. Specifically, in the example illustrated in FIGS. 3A and 3B, the sealing layer 16 is formed on the air gap 18 and the second planarizing layer 15. In the present embodiment, the sealing layer 16 is formed from a silicon oxide, but can be formed, for instance, from a silicon nitride, an organic insulator or the like.

The microlens 17 is formed on the sealing layer so as to correspond to each of the photoelectric conversion elements 11. This microlens 17 is formed from a transparent inorganic or organic material.

The light which has been incident on the effective pixel area 2 of the solid-state imaging apparatus 1 is condensed by the microlens 17, is color-separated by the color filter layers 14a, 14b and the like, then passes through the first planarizing layer 13 and the protective layer 12, and is incident on the photoelectric conversion element 11 formed on the semiconductor substrate 10. The photoelectric conversion element 11 performs photoelectric conversion processing which converts the incident light into an electric charge.

As has been described above, the air gap 18 which is, for instance, an air layer for totally reflecting light is arranged between a certain photoelectric conversion element 11 and the adjacent photoelectric conversion element 11.

In the present embodiment, the air gap 18 in the peripheral region (B of FIG. 1 and FIG. 2) of the effective pixel area illustrated in FIG. 3B is formed so as to have a width larger than the air gap 18 in the central region (A of FIG. 1 and FIG. 2) of the effective pixel area illustrated in FIG. 3A. In the solid-state imaging apparatus 1 having a pixel size of 1.43 um, for instance, the air gap 18 illustrated in FIG. 3B is formed so as to have a width of 0.4 um, and the air gap 18 illustrated in FIG. 3A is formed so as to have a width of 0.1 um.

Figure 4A:
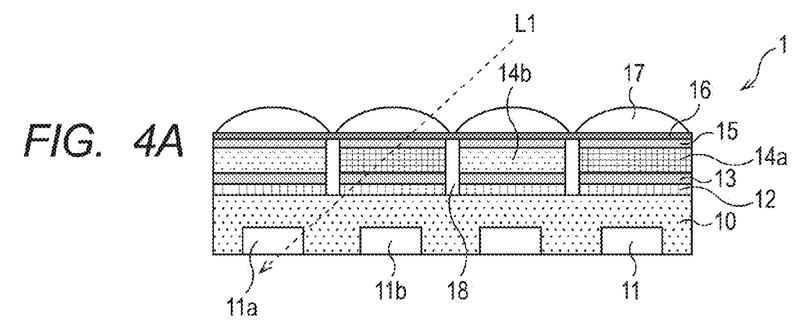
FIG. 4A is a schematic view illustrating one example of a light path when light has been incident on a certain pixel, in the solid-state imaging apparatus according to the first embodiment of the present invention.
Figure 4B:
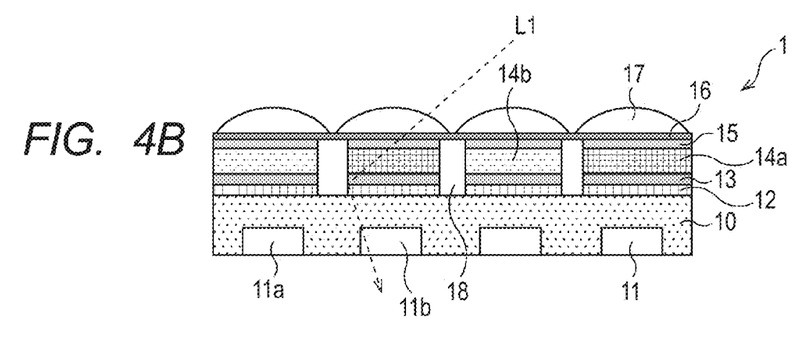
FIG. 4B is a schematic view illustrating one example of a light path when light has been incident on a certain pixel, in the solid-state imaging apparatus according to the first embodiment of the present invention.
Figure 5A:
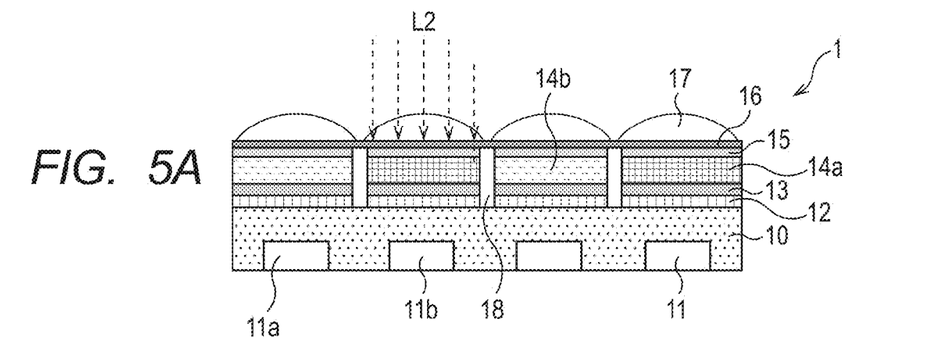
FIG. 5A is a schematic view illustrating one example of a light path when light has been incident on a certain pixel, in the solid-state imaging apparatus according to the first embodiment of the present invention.
Figure 5B:
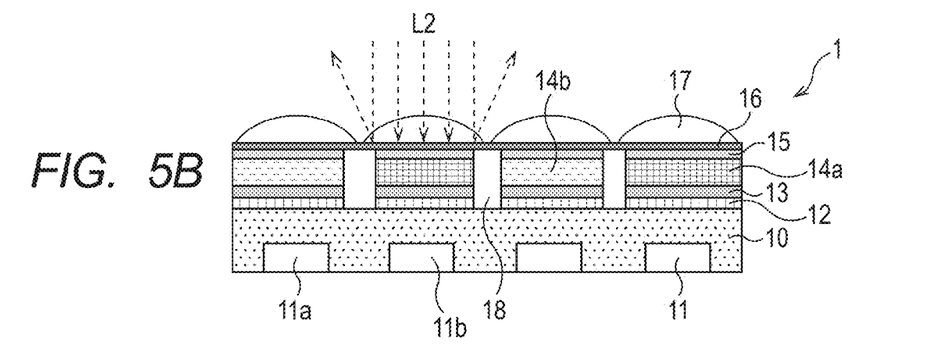
FIG. 5B is a schematic view illustrating one example of a light path when light has been incident on a certain pixel, in the solid-state imaging apparatus according to the first embodiment of the present invention.

FIG. 4A, FIG. 4B, FIG. 5A and FIG. 5B are schematic views illustrating one example of a light path when light is incident on a certain pixel, in the solid-state imaging apparatus according to the first embodiment of the present invention. Here, FIG. 4A, FIG. 4B, FIG. 5A and FIG. 5B illustrate the structure of the solid-state imaging apparatus 1 illustrated in FIGS. 3A and 3B, in such a form that the structure in a lower layer than the semiconductor substrate 10 and the element separator 9 are omitted. In addition, FIG. 4A and FIG. 5A illustrate structures which should be arranged in the central region A of the effective pixel area illustrated in FIG. 3A; and FIG. 4B and FIG. 5B illustrate structures which should be arranged in the peripheral region B of the effective pixel area illustrated in FIG. 3B.

Firstly, FIGS. 4A and 4B will be described below.

FIGS. 4A and 4B illustrate the case where incident light L1 which has a large incident angle and is incident from an oblique direction is incident on a certain pixel (second pixel from left in example illustrated in FIGS. 4A and 4B) of the solid-state imaging apparatus 1.

In the solid-state imaging apparatus 1 illustrated in FIG. 4A, light which has been color-separated by the first color filter layer 14a of the certain pixel passes through a lower part of the first color filter layer 14a, and is incident not on a photoelectric conversion element 11b of the certain pixel but on a photoelectric conversion element 11a of the adjacent pixel. In this case, the sensitivity of the photoelectric conversion element 11b is degraded, and at the same time, color mixture (cross talk) occurs in the photoelectric conversion element 11a.

In contrast to this, in the solid-state imaging apparatus 1 illustrated in FIG. 4B, the air gap 18 is formed so as to have a large width (in other words, air gap formed layer is formed so as to have small width), and the incident light L1 is reflected on the lower part of the air gap 18 to be incident on the photoelectric conversion element 11b of the certain pixel. In this case, the degradation of sensitivity of the photoelectric conversion element 11b and color mixture (cross talk) to the photoelectric conversion element 11a can be prevented.

As has been described above, the air gap 18 illustrated in FIG. 4B having a larger (wider) width is advantageous for the incident light L1 which has a large incident angle and is incident from an oblique direction, in characteristics such as the sensitivity and over the color mixture (cross talk).

In the solid-state imaging apparatus 1 having a pixel size of 1.43 um, for instance, when the light having an incident angle of 40° is incident, the sensitivity in the case where the width of the air gap 18 is 0.4 um is enhanced by approximately 15% compared to the case where the width of the air gap 18 is 0.1 um.

Subsequently, FIGS. 5A and 5B will be described below.

FIGS. 5A and 5B illustrate the case where incident light L2 having a small incident angle (approximately 0°) is incident on a certain pixel (second pixel from left in example illustrated in FIGS. 5A and 5B) of the solid-state imaging apparatus 1.

In the solid-state imaging apparatus 1 illustrated in FIG. 5A, the air gap 18 is formed so as to have a small width (in other words, air gap formed layer is formed so as to have large width), and accordingly the reflection of the incident light L2 on the air gap 18 can be reduced to the minimum. In this case, the degradation of the sensitivity of the photoelectric conversion element 11b can be reduced to the minimum.

In contrast to this, in the solid-state imaging apparatus 1 illustrated in FIG. 5B, the air gap 18 is formed so as to have a large width (in other words, air gap formed layer is formed so as to have small width), and accordingly, a ratio of the reflection of the incident light L2 on the air gap 18 increases compared to the solid-state imaging apparatus 1 illustrated in FIG. 5A. In this case, the degradation of the sensitivity of the photoelectric conversion element 11b becomes remarkable.

As has been described above, the air gap 18 illustrated in FIG. 5A having a smaller (narrower) width is advantageous for the incident light L2 which has a small incident angle and is incident straight down, in characteristics such as the sensitivity.

In the solid-state imaging apparatus 1 having a pixel size of 1.43 um, for instance, when the light is incident straight down, the sensitivity in the case where the width of the air gap 18 is 0.1 um is enhanced by approximately 3% compared to the case where the width of the air gap 18 is 0.4 um.

As has been described above with reference to FIG. 1, the light which is incident on the peripheral region B of the effective pixel area is light having a large incident angle in many cases. On the other hand, the light which is incident on the central region A of the effective pixel area is light which has no incident angle (incident angle of approximately 0°) in many cases.

As has been described with reference to FIG. 4A, FIG. 4B, FIG. 5A and FIG. 5B, the air gap 18 having a larger (wider) width is advantageous for the light having a large incident angle in sensitivity characteristics, and on the other hand, the air gap 18 having a smaller (narrower) width is advantageous for the light having a small incident angle in the sensitivity characteristics.

Then, in the solid-state imaging apparatus 1 according to the present embodiment, the air gap 18 is not formed so as to have the same width in the whole effective pixel area, but is formed so as to have a larger (wider) width in the peripheral region B of the effective pixel area than the width of the air gap 18 in the central region A of the effective pixel area. Thereby, the color mixture (cross talk) and the degradation of sensitivity in the peripheral region B of the effective pixel area can be reduced while the sensitivity in the central region A of the effective pixel area is kept, and the reduction of the sensitivity irregularity in the effective pixel area can be achieved.

Next, a method for manufacturing a solid-state imaging apparatus 1 according to the present embodiment will be described below.

Figure 6:
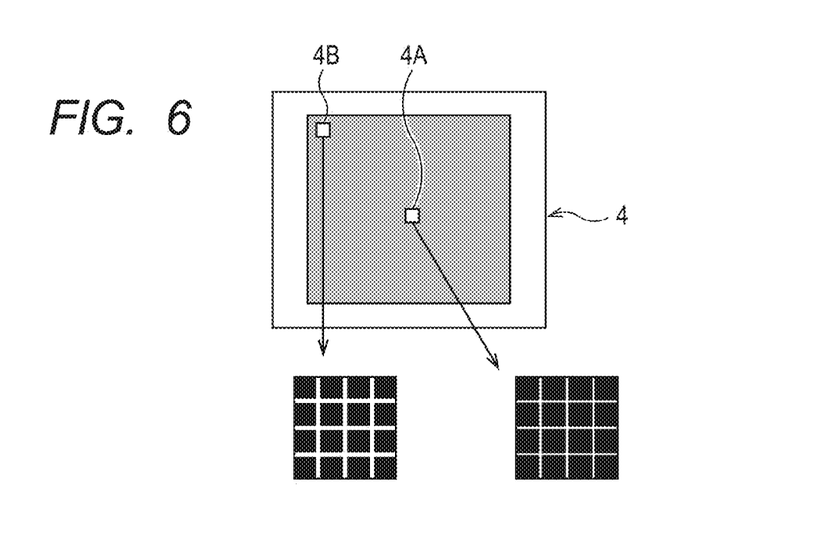
FIG. 6 is a top plan view illustrating one example of a mask (reticle) which is used when an air gap is formed in an air gap formed layer, in a method for manufacturing the solid-state imaging apparatus according to the first embodiment of the present invention.

FIG. 6 is a top plan view illustrating one example of a mask (reticle) which is used when an air gap is formed between air gap formed layers, in a method for manufacturing the solid-state imaging apparatus according to the first embodiment of the present invention. A mask 4 illustrated in FIG. 6 is designed so that a portion corresponding to the photoelectric conversion element 11 of each of the pixels is light-shielded, and a lattice-shaped opening corresponding to a portion on which the air gap 18 is formed becomes gradually wider toward the peripheral region (outer peripheral portion) from the central region. Specifically, in the mask 4 illustrated in FIG. 6, the width of the opening of a portion 4B corresponding to the peripheral region B of the effective pixel area becomes larger (wider) than the width of the opening of a portion 4A corresponding to the central region A of the effective pixel area.

Figure 7A:
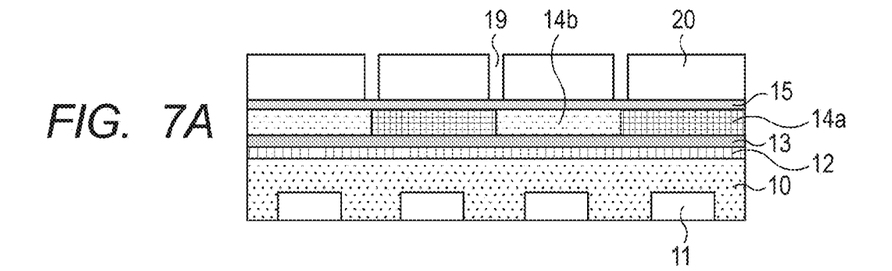
FIG. 7A is a sectional view illustrating one example of the method for manufacturing the solid-state imaging apparatus according to the first embodiment of the present invention.
Figure 7B:
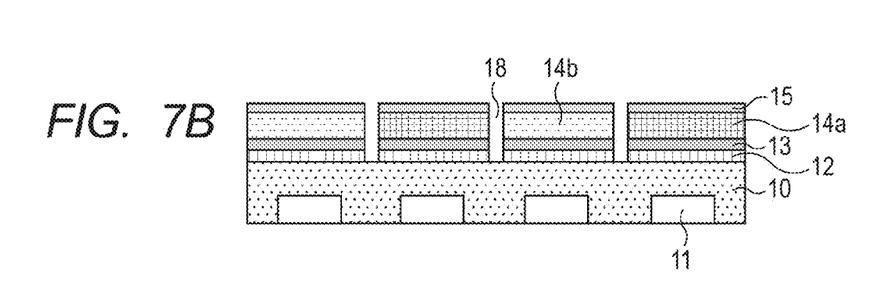
FIG. 7B is a sectional view illustrating one example of the method for manufacturing the solid-state imaging apparatus according to the first embodiment of the present invention.
Figure 7C:
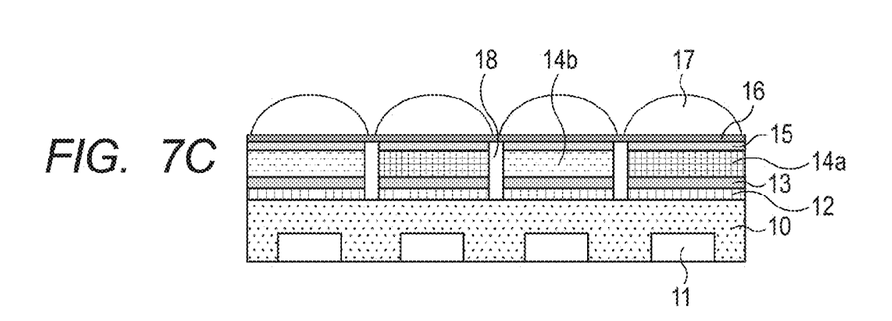
FIG. 7C is a sectional view illustrating one example of the method for manufacturing the solid-state imaging apparatus according to the first embodiment of the present invention.

FIGS. 7A, 7B and 7C are sectional views illustrating one example of the method for manufacturing the solid-state imaging apparatus according to the first embodiment of the present invention. Here, each cross section of the solid-state imaging apparatus illustrated in FIG. 7A to FIG. 7C corresponds to the cross section taken along the line X-X' illustrated in FIG. 2. In addition, FIGS. 7A to 7C illustrate the structure of the solid-state imaging apparatus 1 illustrated in FIGS. 3A and 3B, in such a form that the structure in a lower layer than the semiconductor substrate 10 and the element separator 9 are omitted.

First, a process of FIG. 7A will be described below.

Firstly, the photoelectric conversion element 11 is formed on each of the pixels on one face of the semiconductor substrate 10 which is formed, for instance, from silicon, with a well-known manufacturing method.

After that, as is illustrated in FIGS. 3A and 3B, the element separator 9 is formed, and the gate electrode 8, the interlayer insulation layer 30 and the wiring layer 31 are formed in a side of one surface of the semiconductor substrate 10. After that, the supporting substrate 32 is affixed to the semiconductor substrate 10 and is reversed.

Subsequently, a protective layer 12 which is formed, for instance, from a silicon nitride is formed on one face in an opposite side to the face (the other face) of the semiconductor substrate 10, which contacts the interlayer insulation layer 30. This protective layer 12 functions also as an antireflection layer, for instance.

Subsequently, the first planarizing layer 13 which is formed, for instance, from an organic insulator of one layer is formed on the protective layer 12. Incidentally, the upper face of the first planarizing layer 13 may be planarized by planarizing treatment. Here, in the present embodiment, this first planarizing layer 13 is formed of a layer which is formed from an organic insulator of one layer, but can be formed of a layer which is formed, for instance, from an inorganic insulator, or of a plurality of layers. This planarizing layer 13 also functions, for instance, as an underlayer of the color filter layers 14a and 14b.

Subsequently, the first color filter layer 14a which is formed from a resin containing a coloring matter of red (R) is formed on the first planarizing layer 13 above a predetermined photoelectric conversion element 11 that becomes a red pixel. Specifically, the resin which contains the coloring matter of red (R) and constitutes the first color filter layer 14a is formed on the whole surface of the first planarizing layer 13, the resin except for a region in which the red pixel is formed is removed through patterning by a light exposure process, and the first color filter layer 14a is formed on the region in which the red pixel is formed.

Subsequently, the second color filter layer 14b which is formed from a resin containing a coloring matter of green (G) is formed on the first planarizing layer 13 above a predetermined photoelectric conversion element 11 that becomes a green pixel. Specifically, the resin which contains the coloring matter of green (G) and constitutes the second color filter layer 14b is formed on the whole surface of the first planarizing layer 13, the resin except for a region in which the green pixel is formed is removed through patterning by a light exposure process, and the second color filter layer 14b is formed on the region in which the green pixel is formed.

After that, though being not shown, the third color filter layer which is formed from a resin containing a coloring matter of blue (B) is formed on the first planarizing layer 13 above a predetermined photoelectric conversion element 11 that becomes a blue pixel, with a similar manufacturing method to those for the first color filter layer 14a and the second color filter layer 14b.

Subsequently, the second planarizing layer 15 is formed on each of the color filter layers, which is formed, for instance, from a resin, and whose upper face is planarized by planarizing treatment. Here, in the present embodiment, the second planarizing layer 15 is formed of a layer which is formed from a resin, but can also be formed of a layer which is formed, for instance, from an inorganic insulator such as a silicon oxide.

Subsequently, a photoresist is applied onto the second planarizing layer 15, then the applied photoresist is exposed to light with the use of the mask (reticle) 4 illustrated in FIG. 6 and is developed to form a photoresist pattern 20 which has an opening 19 on the upper region of the boundary portion (boundary portion between the pixels) between the color filter layers. The mask 4 illustrated in FIG. 6 is used in the process, and thereby the opening 19 of the photoresist pattern 20 is structured so that the width in the peripheral region B of the effective pixel area 2 is larger (wider) than the width in the central region A of the effective pixel area 2. Specifically, the opening 19 of the photoresist pattern 20 is formed by light exposure and development with the use of the mask 4 illustrated in FIG. 6, and accordingly the width of the opening 19 gradually increases from the central region A of the effective pixel area 2 toward the peripheral region B of the effective pixel area 2.

Subsequently, in the process of FIG. 7B, the air gap formed layer (second planarizing layer 15, color filter layers 14a, 14b and the like, first planarizing layer 13 and protective layer 12) in a portion which is not covered with the photoresist pattern 20 is removed by dry etching in which the photoresist pattern 20 is used as a mask. Specifically, the boundary portions among the color filter layers 14a, 14b and the like are removed. Thereby, the air gaps 18 are formed among the color filter layers 14a, 14b and the like. Specifically, the air gap 18 is formed by the dry etching in which the photoresist pattern 20 is used as the mask, and accordingly the width of the air gap 18 gradually increases from the central region A of the effective pixel area 2 toward the peripheral region B of the effective pixel area 2.

Incidentally, in the dry etching in which the photoresist pattern 20 is used as the mask, when a layer to be etched is an organic material, an etching process of using, for instance, an $O_3$ (ozone)-based gas is performed, and when the layer to be etched is an inorganic material, an etching process of using, for instance, a CF-based gas is performed. In the case of the example illustrated in FIGS. 7A to 7C, the layer formed from the organic material and the layer formed from the inorganic material coexist in the air gap formed layer, and accordingly the dry etching process in which the photoresist pattern 20 is used as the mask results in being switched on the way every time when the material changes.

In addition, in the example illustrated in FIG. 7B, layers are etched down to the protective layer 12, but a form may be adopted in which layers are removed down to the first planarizing layer 13 by etching, and the protective layer 12 is not removed by etching and is left, for the purpose of enhancing the protective performance. Specifically, the lower end of the air gap 18 may be positioned on the upper face of the protective layer 12.

After that, the photoresist pattern 20 is removed.

After the air gap 18 has been formed and the photoresist pattern 20 has been removed, subsequently, in the process of FIG. 7C, firstly the sealing layer (cap layer) 16 for sealing the air gap 18 is formed. Specifically, in the example illustrated in FIG. 7C, the sealing layer 16 is formed on the air gap 18 and the second planarizing layer 15. At this time, the sealing layer 16 needs to be film-formed so as to be thicker than the width of the air gap 18, in order not to clog the air gap 18. In the present embodiment, the sealing layer 16 is formed from a silicon oxide, but can also be formed of a layer which is formed, for instance, from a silicon nitride, an organic insulator or the like.

Subsequently, the microlens 17 corresponding to each of the photoelectric conversion elements 11 is formed on the sealing layer 16. This microlens 17 is formed from a transparent inorganic or organic material. This microlens 17 may be formed by patterning the resin and then heating the patterned resin to reflow the resin, or may be formed by transfer etching with the use of a mask-shaped resist pattern.

The solid-state imaging apparatus according to the first embodiment is produced through each of the above-described processes in FIG. 7A to FIG. 7C.

Second Embodiment

Next, a second embodiment of the present invention will be described below.

A method for manufacturing a solid-state imaging apparatus 1 according to the present embodiment will be described below.

Figure 8:
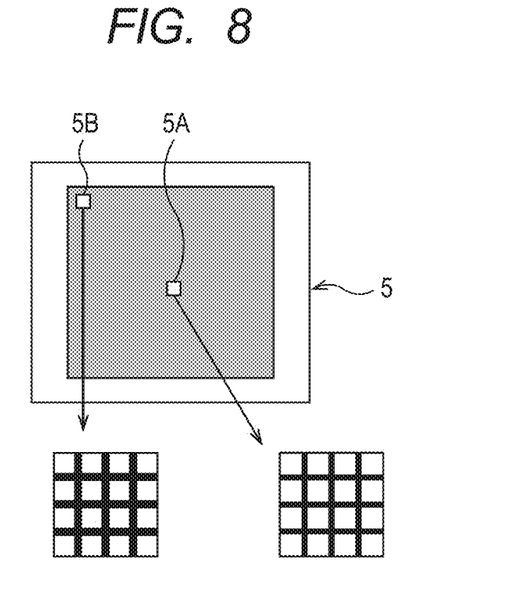
FIG. 8 is a top plan view illustrating one example of a mask (reticle) which is used when an air gap is formed in an air gap formed layer, in a method for manufacturing a solid-state imaging apparatus according to a second embodiment of the present invention.

FIG. 8 is a top plan view illustrating one example of a mask (reticle) which is used when an air gap is formed on an air gap formed layer, in a method for manufacturing a solid-state imaging apparatus according to the second embodiment of the present invention. This mask illustrated in FIG. 8 is designed so that a portion corresponding to the photoelectric conversion element 11 of each of the pixels is opened, and a lattice-shaped light-shielding portion corresponding to a portion in which the air gap 18 is formed becomes gradually wider toward the peripheral region (outer peripheral portion) from the central region. Specifically, in the mask 5 illustrated in FIG. 8, the width of the light-shielding portion of a portion 5B corresponding to the peripheral region B of the effective pixel area becomes larger (wider) than the width of the light-shielding portion of a portion 5A corresponding to the central region A of the effective pixel area.

FIGS. 9A, 9B, 9C, 9D and 9E are sectional views illustrating one example of the method for manufacturing the solid-state imaging apparatus according to the second embodiment of the present invention. Here, the cross section of the solid-state imaging apparatus illustrated in FIG. 9A to FIG. 9E corresponds to the cross section taken along the line X-X' illustrated in FIG. 2. In addition, the solid-state imaging apparatus illustrated in FIG. 9A to FIG. 9E illustrates the structure of the solid-state imaging apparatus 1 illustrated in FIGS. 3A and 3B, in such a form that the lower layer than the semiconductor substrate 10 and the element separator 9 are omitted for the simplicity of description, though the solid-state imaging apparatus 1 includes those structures as well.

Firstly, a process of FIG. 9A will be described below.

Firstly, the photoelectric conversion element 11 is formed in each of the pixels on one face of the semiconductor substrate 10 which is formed, for instance, from silicon, with a well-known manufacturing method.

Subsequently, a protective layer 12 which is formed, for instance, from a silicon nitride is formed on the other face in an opposite side to the above-described one face of the semiconductor substrate 10. This protective layer 12 functions also as an antireflection layer, for instance.

Subsequently, a first planarizing layer 13 is formed on the protective layer 12, which is formed, for instance, from an organic insulator of one layer, and whose upper face is planarized by planarizing treatment. Here, in the present embodiment, this first planarizing layer 13 is formed of a layer which is formed from an organic insulator of one layer, but can be formed of a layer which is formed, for instance, from an inorganic insulator, or of a plurality of layers.

Subsequently, a layer 21a for separation is formed on the first planarizing layer 13, which is formed, for instance, from a silicon oxide. Here, in the present embodiment, the layer 21a for separation is formed of the layer which is formed from the silicon oxide, but can also be formed of a layer which is formed, for instance, from an inorganic substance such as a silicon nitride.

Subsequently, a photoresist is applied onto the layer 21a for separation, then the applied photoresist is exposed to light with the use of the mask (reticle) 5 illustrated in FIG. 8 and is developed to form a photoresist pattern 20 which has an opening 19 on the upper region of each of the photoelectric conversion elements 11 (to form photoresist pattern 20 on boundary portion between pixels). The mask 5 illustrated in FIG. 8 is used in the process, and thereby the photoresist pattern 20 is structured so that the width in the peripheral region B of the effective pixel area 2 is larger (wider) than the width in the central region A of the effective pixel area 2. Specifically, the photoresist pattern 20 is formed by light exposure and development with the use of the mask 5 illustrated in FIG. 8, and accordingly the width of the photoresist pattern 20 gradually increases from the central region A of the effective pixel area 2 toward the peripheral region B of the effective pixel area 2.

Subsequently, in the process of FIG. 9B, the layer 21a for separation in a portion which is not covered with the photoresist pattern 20 is removed by dry etching in which the photoresist pattern 20 is used as a mask. Thereby, the separation layer 21 is formed on the upper region of a portion between each of the photoelectric conversion elements 11. In the present embodiment, the separation layer 21 is formed by the dry etching in which the photoresist pattern 20 is used as the mask, and accordingly the separation layer 21 is structured so that the width in the peripheral region B of the effective pixel area 2 is larger (wider) than the width in the central region A of the effective pixel area 2. Specifically, the separation layer 21 is formed by the dry etching in which the photoresist pattern 20 is used as the mask, and accordingly the width of the separation layer 21 gradually increases from the central region A of the effective pixel area 2 toward the peripheral region B of the effective pixel area 2.

After that, the photoresist pattern 20 is removed.

Subsequently, in the process of FIG. 9C, firstly, a first color filter layer 14a which is formed from a resin containing a coloring matter of red (R) is formed on the first planarizing layer 13 above a predetermined photoelectric conversion element 11 that becomes a red pixel, so as to contact the separation layer 21. Specifically, the resin which contains the coloring matter of red (R) and constitutes the first color filter layer 14a is formed on the whole surface of the first planarizing layer 13, the resin except for a region in which the red pixel is formed is removed through patterning by a light exposure process, and the first color filter layer 14a is formed on the region in which the red pixel is formed.

Subsequently, a second color filter layer 14b which is formed from a resin containing a coloring matter of green (G) is formed on the first planarizing layer 13 above a predetermined photoelectric conversion element (light receiving element) 11 that becomes a green pixel, so as to contact the separation layer 21. Specifically, the resin which contains the coloring matter of green (G) and constitutes the second color filter layer 14b is formed on the whole surface of the first planarizing layer 13, the resin except for a region in which the green pixel is formed is removed through patterning by a light exposure process, and the second color filter layer 14b is formed on the region in which the green pixel is formed.

After that, though being not shown, the third color filter layer which is formed from a resin containing a coloring matter of blue (B) is formed on the first planarizing layer 13 above a predetermined photoelectric conversion element 11 that becomes a blue pixel so as to contact the separation layer 21, with a similar manufacturing method to those for the first color filter layer 14a and the second color filter layer 14b.

Subsequently, a layer 16a for sealing is formed on each of the color filter layers, which is formed, for instance, from an organic insulator or the like. At this time, a lattice-shaped groove is formed on the layer 16a for sealing, for instance, with the use of the mask 5. Specifically, the layer 16a for sealing is formed so as to expose the whole or a part of the upper face of the separation layer 21.

After the layer 16a for sealing has been formed, subsequently, in the step of FIG. 9D, firstly, the separation layer 21 is removed by wet etching in which the layer 16a for sealing or the like is used as a mask, and the air gap 18 is formed between each of the color filter layers. Specifically, the air gap 18 is formed by the removal of the separation layer 21, and accordingly the width of the air gap 18 gradually increases from the central region A of the effective pixel area 2 toward the peripheral region B of the effective pixel area 2.

Incidentally, in the wet etching in the present process, phosphoric acid, fluoric acid or the like is used, for instance. After the air gap 18 has been formed, subsequently, the layer 16a for sealing is heated and softened so as to overhang the opening region of the air gap 18 (to mutually connect adjacent layers 16a for sealing in examples of FIG. 9C and FIG. 9D), and thereby the sealing layer (cap layer) 16 for sealing the air gap 18 is formed.

Subsequently, in the process of FIG. 9E, the microlens 17 corresponding to each of the photoelectric conversion elements 11 is formed on the sealing layer (cap layer) 16. This microlens 17 is formed from a transparent inorganic or organic material.

Figure 9A:
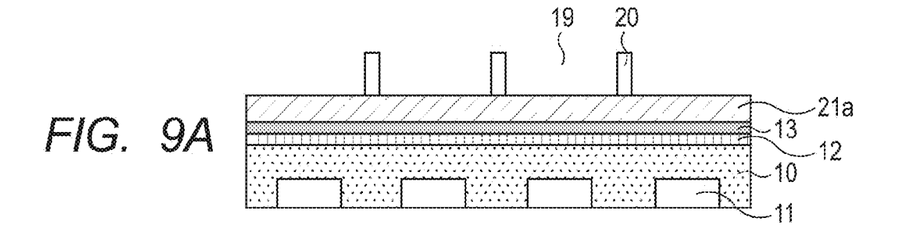
FIG. 9A is a sectional view illustrating one example of the method for manufacturing the solid-state imaging apparatus according to the second embodiment of the present invention.
Figure 9B:
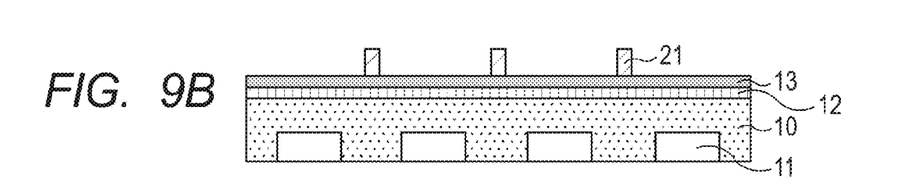
FIG. 9B is a sectional view illustrating one example of the method for manufacturing the solid-state imaging apparatus according to the second embodiment of the present invention.
Figure 9C:
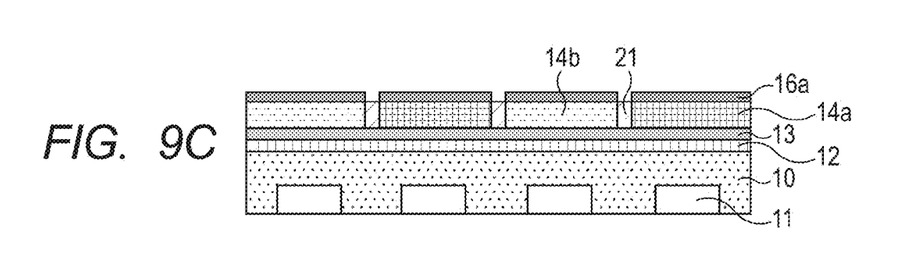
FIG. 9C is a sectional view illustrating one example of the method for manufacturing the solid-state imaging apparatus according to the second embodiment of the present invention.
Figure 9D:
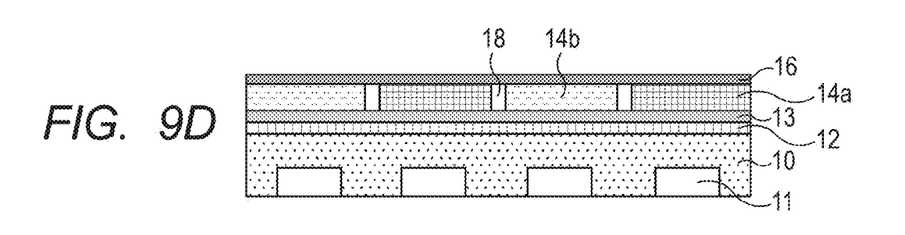
FIG. 9D is a sectional view illustrating one example of the method for manufacturing the solid-state imaging apparatus according to the second embodiment of the present invention.
Figure 9E:
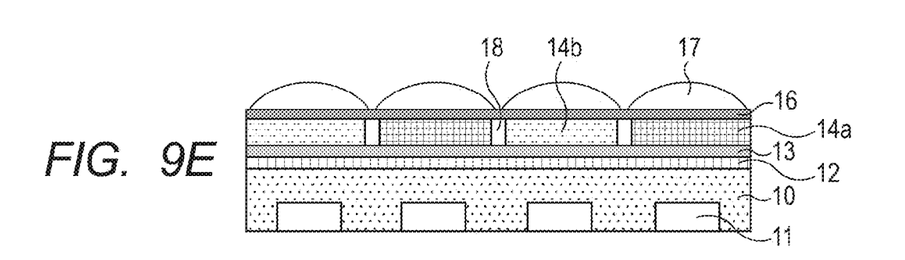
FIG. 9E is a sectional view illustrating one example of the method for manufacturing the solid-state imaging apparatus according to the second embodiment of the present invention.

The solid-state imaging apparatus according to the second embodiment is produced through each of the above-described processes in FIG. 9A to FIG. 9C. Incidentally, in the present embodiment, the color filter layer corresponds to the air gap formed layer.

For information, the planarizing layer may be formed on the sealing layer 16, though being not shown in FIGS. 9A, 9B, 9C, 9D and 9E.

Third Embodiment

Next, a third embodiment of the present invention will be described below.

The solid-state imaging apparatuses according to the above-described first and second embodiments have been a so-called back side illumination type of a solid-state imaging apparatus, but the present invention is not limited to this form. For instance, a so-called surface irradiation type of a solid-state imaging apparatus can also be applied to the present invention.

Figure 10:
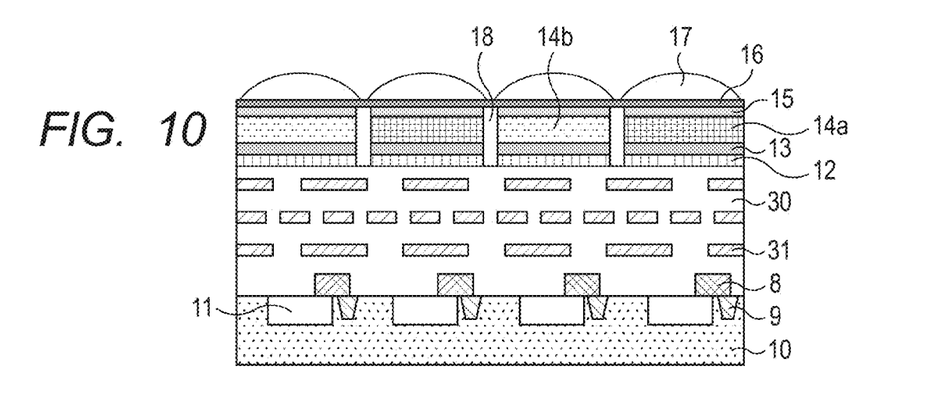
FIG. 10 is a sectional view of a solid-state imaging apparatus according to a third embodiment of the present invention.

FIG. 10 is a sectional view of a solid-state imaging apparatus according to a third embodiment of the present invention. FIG. 10 is a schematic sectional view taken along the line X-X' illustrated in FIG. 2. In addition, in FIG. 10, similar structures to those illustrated in FIGS. 3A and 3B are designated by the same reference numerals.

The solid-state imaging apparatus 1 illustrated in FIG. 10, the photoelectric conversion element 11 and the element separator 9 are formed on the surface of the semiconductor substrate 10 which is formed, for instance, from silicon. Furthermore, the interlayer insulation layer 30 and the gate electrode 8 are formed on the surface of the semiconductor substrate 10. In addition, a multilayer (three layers in example illustrated in FIG. 10) of the wiring layer 31 is formed in the inner part of the interlayer insulation layer 30. Then, the protective layer 12, the first planarizing layer 13, the color filter layers 14a, 14b and the like, and the second planarizing layer 15 are arranged on the interlayer insulation layer 30, as the air gap formed layer. In addition, the air gap 18 is formed on the boundary portion of the pixels in the air gap formed layer. The sealing layer 16 for sealing the air gap 18 is formed on the second planarizing layer 15, and the microlens 17 is formed on the sealing layer 16 corresponding to each of the photoelectric conversion elements 11.

Fourth Embodiment

Next, a fourth embodiment of the present invention will be described below.

Figure 11A:
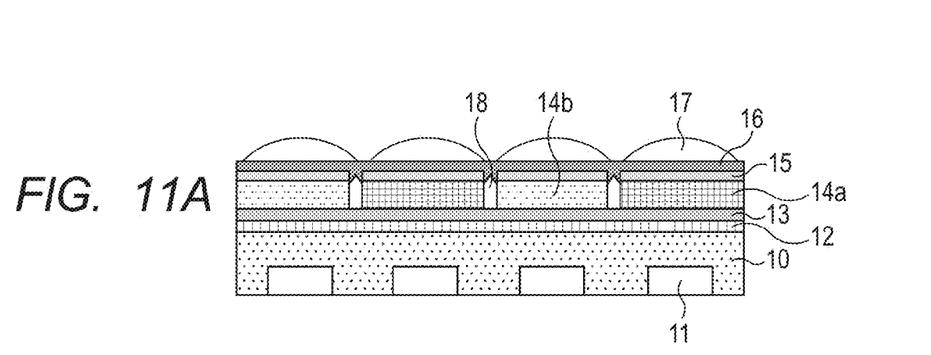
FIG. 11A is a sectional view of a solid-state imaging apparatus according to a fourth embodiment of the present invention.
Figure 11B:
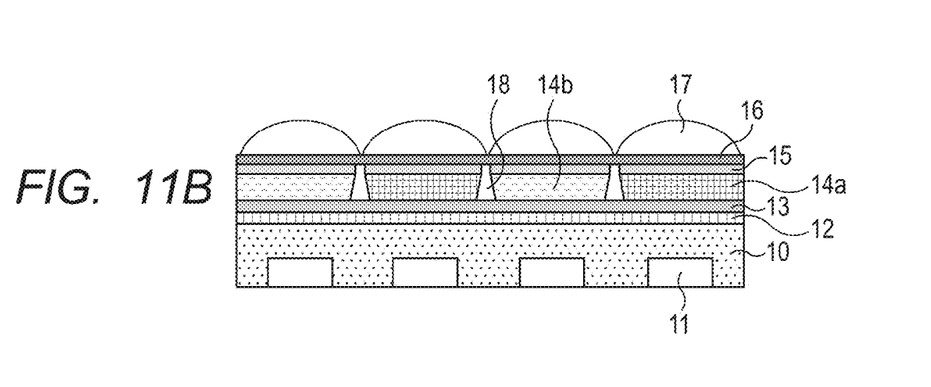
FIG. 11B is a sectional view of the solid-state imaging apparatus according to the fourth embodiment of the present invention.

FIGS. 11A and 11B are a sectional view of a solid-state imaging apparatus according to a fourth embodiment of the present invention. FIGS. 11A and 11B are a schematic sectional view taken along the line X-X' illustrated in FIG. 2. Incidentally, FIGS. 11A and 11B illustrate the structure of the solid-state imaging apparatus 1 illustrated in FIGS. 3A and 3B, in such a form that the structure in a lower layer than the semiconductor substrate 10 and the element separator 9 are omitted. In addition, in the example illustrated in FIGS. 11A and 11B, an example is illustrated in which even when the air gap 18 is formed by etching, the boundary portions between the pixels in the protective layer 12 and the first planarizing layer 13 are not removed.

The solid-state imaging apparatus illustrated in FIG. 11A is different from the above-described solid-state imaging apparatuses according to the first embodiment and the like, in the point that the tip in the upper part of the air gap 18 has a peaky shape. This peaky shape of the tip in the upper part of the air gap 18 can be formed, for instance, by the control of an etching condition to be set when the air gap 18 is formed, of a film thickness of the sealing layer 16, and the like.

The solid-state imaging apparatus illustrated in FIG. 11B is different from the above-described solid-state imaging apparatuses according to the first embodiment and the like, in the point that the air gap 18 has a tapered shape. This tapered shape of the air gap 18 can be formed, for instance, by the control of an etching condition to be set when the air gap 18 is formed and a shape of a photoresist pattern.

Both of the solid-state imaging apparatus illustrated in FIG. 11A and FIG. 11B can make each of the pixels to have a large effective area (opening) with respect to the incident light, can accordingly condense more incident light, and can enhance its sensitivity.

Fifth Embodiment

Next, a fifth embodiment of the present invention will be described below.

Figure 12:
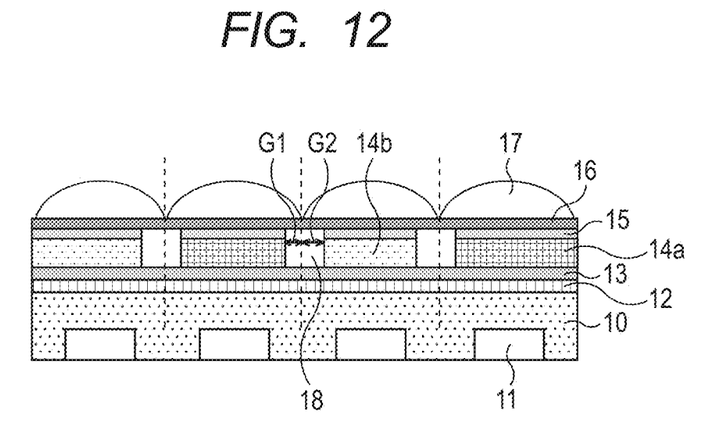
FIG. 12 is a sectional view of a solid-state imaging apparatus according to a fifth embodiment of the present invention.

FIG. 12 is a sectional view of a solid-state imaging apparatus according to a fifth embodiment of the present invention. FIG. 12 is a schematic sectional view taken along the line X-X' illustrated in FIG. 2. Incidentally, FIG. 12 illustrates the structure of the solid-state imaging apparatus 1 illustrated in FIGS. 3A and 3B, in such a form that the structure in a lower layer than the semiconductor substrate 10 and the element separator 9 are omitted. In addition, in the example illustrated in FIG. 12, an example is illustrated in which even when the air gap 18 is formed by etching, the boundary portions between the pixels in the protective layer 12 and the first planarizing layer 13 are not removed.

In the solid-state imaging apparatus according to the present embodiment, a position in which the air gap 18 is formed is different from that in the above-described solid-state imaging apparatuses according to the first embodiment and the like.

Specifically, the air gap 18 is formed so that a distance G1 from the boundary portion between the pixels to the first color filter layer 14a is different from a distance G2 from the boundary portion between the pixels to the second color filter layer 14b.

When light is incident, the opening of the pixel works as a slit, and diffracted light is generated. Furthermore, the light which has been diffracted on the lower face of the color filter layer is incident on the adjacent pixel, and thereby color mixture (cross talk) occurs. As the opening of the pixel is narrower, the diffracted light tends to spread wider.

In addition, the diffracted light has a dependence on a wavelength, and has properties of more widely spreading as the light has a longer wavelength. In the solid-state imaging apparatus illustrated in FIG. 12, for instance, suppose that the first color filter layer 14a is red (R) and the second color filter layer 14b is green (G). The second color filter layer 14a has a longer wavelength than that of the second color filter layer 14b, and accordingly the diffracted light tends to spread wider. In FIG. 12, as has been described above, the distance between the boundary portion of the pixels and the first color filter layer 14a is defined as G1, and the distance between the boundary portion of the pixels and the second color filter layer 14b as G2. The air gap 18 is formed at such a position that the distance G2 is larger than the distance G1, and thereby the diameter of the opening of the first color filter layer 14a becomes larger than the diameter of the opening of the second color filter layer 14b. By the increase of the diameter of the opening of the first color filter layer 14a, the diffracted light can be narrowed, and thereby the leakage of light to an adjacent pixel can be reduced.

In the present embodiment, the first color filter layer 14a is set at red (R), and the second color filter layer 14b is set at green (G), but the present invention is not limited to this form. The color filter layers may be other colors such as blue (B), magenta (M) and yellow (Y) as long as the color of the first color filter layer 14a is different from the color of the second color filter layer 14b.

In addition, in the present embodiment, the solid-state imaging apparatus is structured so as to have the color filter layers 14a, 14b and the like and the microlens 17 formed therein, but even the solid-state imaging apparatus which is structured so as to have the color filter layers 14a, 14b and the like and the microlens not formed therein provides effects of reducing sensitivity irregularity and being capable of reducing the degradation of sensitivity in the peripheral region of the effective pixel area, as long as the solid-state imaging apparatus has a photoelectric conversion element.

OTHER EMBODIMENTS

In the above-described solid-state imaging apparatus according to each of the embodiments of the present invention, the example has been described in which the planarizing layer is formed, but this planarizing layer can be appropriately omitted, as needed. In addition, the above-described solid-state imaging apparatus according to each of the embodiments of the present invention can be applied also to the case where the surface is irradiated with light.

Note that each of the above embodiments of the present invention is merely examples of how the present invention can be practiced, and the technical scope of the present invention should not be restrictedly interpreted by the embodiments. In other words, the present invention can be carried out in various forms, in the extent which does not deviate from the technical idea or the main feature. For instance, the structures of each of the embodiments can be appropriately combined and/or modified.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-127887, filed on Jun. 18, 2013, which is hereby incorporated by reference herein in its entirety.

What is claimed is:

1. A solid-state imaging apparatus having a pixel area including a plurality of light receiving elements, comprising:
    a semiconductor substrate in which the plurality of light receiving elements are formed, and
    an air gap layer arranged above the semiconductor substrate, and including a plurality of portions arranged correspondingly to the plurality of light receiving elements and air gaps arranged between the plurality of portions and having a refractive index lower than that of the plurality of portions, wherein
    a width of the air gaps gradually increases from a central region in the pixel area toward a peripheral region in the pixel area, the widths are to be measured at the same point along the height of each of the air gaps.

2. The solid-state imaging apparatus according to claim 1, wherein one of the plurality of portions arranged in the central region in the pixel area has a width larger than a width of another one of the plurality of portions arranged in the peripheral region in the pixel area.

3. The solid-state imaging apparatus according to claim 1, wherein widths of the air gaps increases gradually in a direction from the central region in the pixel area to the peripheral region in the pixel area.

4. The solid-state imaging apparatus according to claim 1, wherein the plurality of portions comprises a plurality of layers including a color filter layer that is spaced apart by the air gaps.

5. The solid-state imaging apparatus according to claim 1, wherein the plurality of portions consist of a color filter layer that is spaced apart by the air gaps.

6. A manufacturing method of a solid-state imaging apparatus having a pixel area including a plurality of light receiving elements, comprising:
    forming the plurality of light receiving elements in a semiconductor substrate;
    forming a layer arranged above the semiconductor substrate; and
    forming air gaps in the layer, such that a width of the air gaps gradually increases from a central region in the pixel area toward a peripheral region in the pixel area, the widths are to be measured at the same point along the height of each of the air gaps.

7. The manufacturing method according to claim 6, wherein a first portion of the layer between the air gaps in the central region in the pixel area has a width larger than a width of a second portion of the layer between the air gaps in the peripheral region in the pixel area.

8. The manufacturing method according to claim 6, wherein the forming air gaps includes removing a part of the layer by an etching process.

* * * * *